United States Patent
Park et al.

(10) Patent No.: US 7,492,432 B2
(45) Date of Patent: Feb. 17, 2009

(54) LIQUID CRYSTAL DISPLAY DEVICE AND METHOD OF FABRICATING THE SAME

(75) Inventors: Yong In Park, Anyang-si (KR); Juhn Suk Yoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 631 days.

(21) Appl. No.: 11/166,128

(22) Filed: Jun. 27, 2005

(65) Prior Publication Data
US 2006/0145160 A1 Jul. 6, 2006

(30) Foreign Application Priority Data
Dec. 31, 2004 (KR) .................. 10-2004-0118559

(51) Int. Cl.
G02F 1/1343 (2006.01)
G02F 1/1339 (2006.01)
H01L 27/14 (2006.01)

(52) U.S. Cl. .................. 349/147; 349/39; 349/153; 257/72

(58) Field of Classification Search ............. 349/38–39, 349/147, 152, 43, 153, 190; 257/72
See application file for complete search history.

(56) References Cited

U.S. PATENT DOCUMENTS

| 6,403,409 | B1 | 6/2002 | You |
| 6,617,203 | B2 | 9/2003 | Kim et al. |
| 6,753,235 | B2 | 6/2004 | So et al. |
| 2001/0003657 | A1 | 6/2001 | Lee |
| 2002/0130324 | A1* | 9/2002 | Song et al. ............ 257/72 |
| 2002/0135293 | A1* | 9/2002 | Aruga .................. 313/493 |
| 2006/0102899 | A1* | 5/2006 | Lee et al. ............. 257/59 |

FOREIGN PATENT DOCUMENTS

| KR | 97-003717 B1 | 3/1997 |
| KR | 97-008589 B1 | 5/1997 |
| KR | 97-011966 B1 | 8/1997 |
| KR | 0161461 B1 | 8/1998 |
| KR | 0175408 B1 | 11/1998 |
| KR | 0177785 B1 | 11/1998 |
| KR | 0184509 B1 | 12/1998 |
| KR | 10-0192593 B1 | 1/1999 |
| KR | 2000-0025565 | 5/2000 |
| KR | 2000-0026894 | 5/2000 |
| KR | 2000-0026895 | 5/2000 |

(Continued)

*Primary Examiner*—Mike Qi
(74) *Attorney, Agent, or Firm*—McKenna Long & Aldridge LLP (57) ABSTRACT

A thin film transistor substrate of a poly-silicon liquid crystal display device and a simplified method of fabricating the same are disclosed. A liquid crystal display device according to the present invention includes a gate line and a data line connected to a thin film transistor; a gate pad connected to the gate line and a data pad connected to the data line, the data pad having the same cross-sectional structure as the gate pad; and a data link extended from the data pad and connected to the data line via a first contact hole, wherein the data line and the first contact hole are formed inside an area sealed by a sealant.

34 Claims, 11 Drawing Sheets

FOREIGN PATENT DOCUMENTS

| | | |
|---|---|---|
| KR | 2000-0031451 | 6/2000 |
| KR | 2000-0041223 | 7/2000 |
| KR | 2000-0075031 | 12/2000 |
| KR | 2001-019665 | 3/2001 |
| KR | 2001-0019668 | 3/2001 |
| KR | 10-0297706 | 5/2001 |
| KR | 2001-0054739 | 7/2001 |
| KR | 2001-0055071 | 7/2001 |
| KR | 2001-0056037 | 7/2001 |
| KR | 2001-0110917 | 12/2001 |
| KR | 2002-0009188 | 2/2002 |
| KR | 2002-0022258 | 3/2002 |
| KR | 2002-0071061 | 9/2002 |
| KR | 2002-0071062 | 9/2002 |
| KR | 2002-0074897 | 10/2002 |
| KR | 2002-0078116 | 10/2002 |
| KR | 2002-0079196 | 10/2002 |
| KR | 2002-0080202 | 10/2002 |
| KR | 2003-0006619 | 1/2003 |
| KR | 2003-0030286 | 4/2003 |

* cited by examiner

LIQUID CRYSTAL DISPLAY DEVICE AND METHOD OF FABRICATING THE SAME

This application claims the benefit of Korean Patent Application No. P2004-118559, filed on Dec. 31, 2004, which is hereby incorporated by reference for all purposes as if fully set forth herein.

BACKGROUND OF THE INVENTION

1. Field of the Invention

This invention relates to a display device, and more particularly to a thin film transistor substrate of a poly-silicon liquid crystal display device and a simplified method of fabricating the same.

2. Discussion of the Related Art

Generally, a liquid crystal display (LCD) device, which includes a plurality of liquid crystal cells in a matrix configuration in a liquid crystal display panel, displays images by controlling the transmittance of light in accordance with video signals. In each liquid crystal cell, a thin film transistor (TFT) is used as a switching device to independently supply a video signal. An active layer of such a TFT is generally formed of either amorphous silicon or polycrystalline silicon (poly-silicon). Because the carrier mobility of poly-silicon is approximately hundred times faster than the carrier mobility of amorphous silicon, high-speed driving circuits can be integrally formed in the LCD panel with the poly-silicon technology.

A poly-silicon LCD device generally includes a TFT substrate provided with driving circuits and a color filter substrate provided with a color filter, with liquid crystal provided therebetween.

Figure 1:
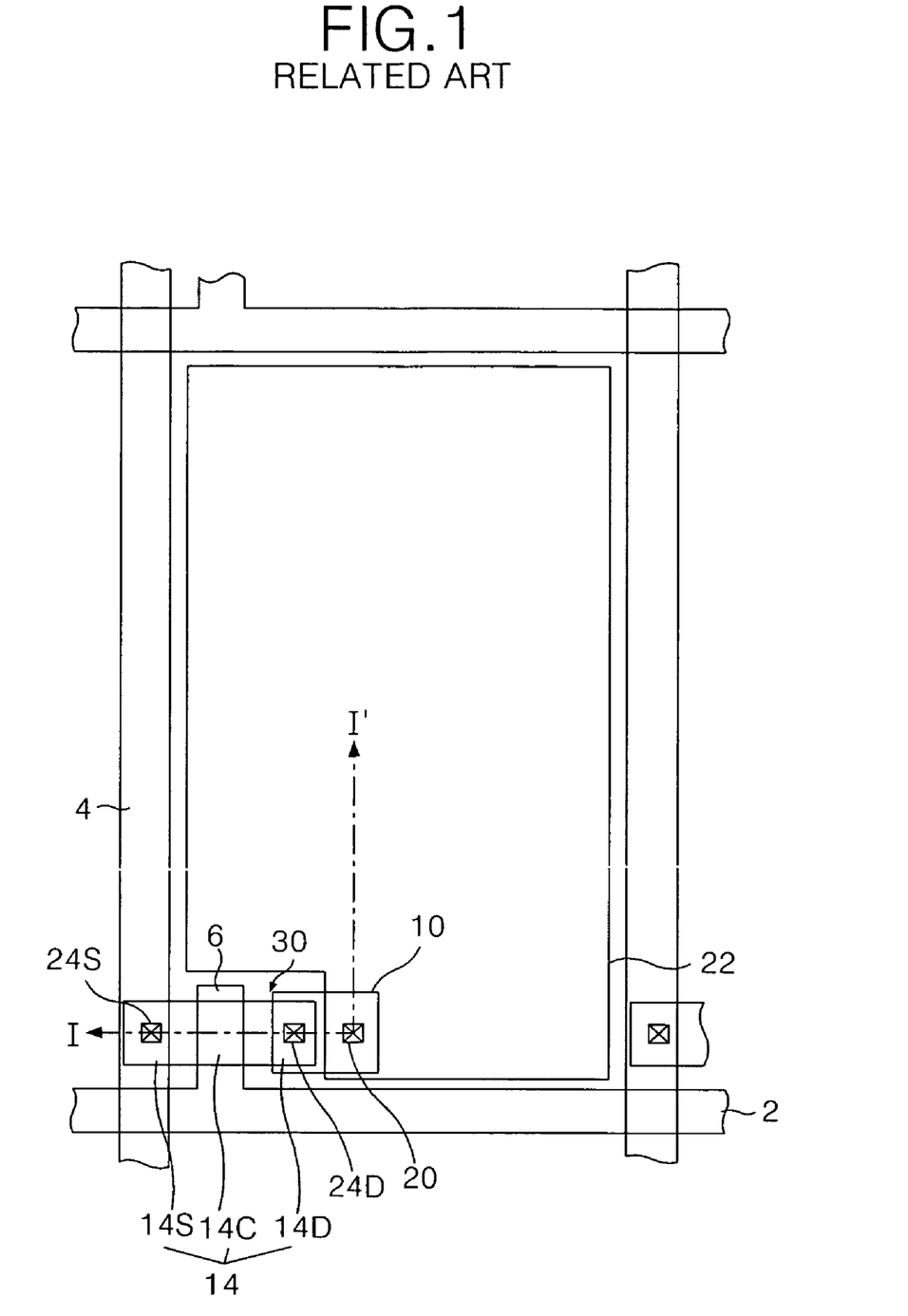
FIG. 1 is a plan view illustrating a portion of a TFT substrate in a poly-silicon LCD device according to the related art.
Figure 2:
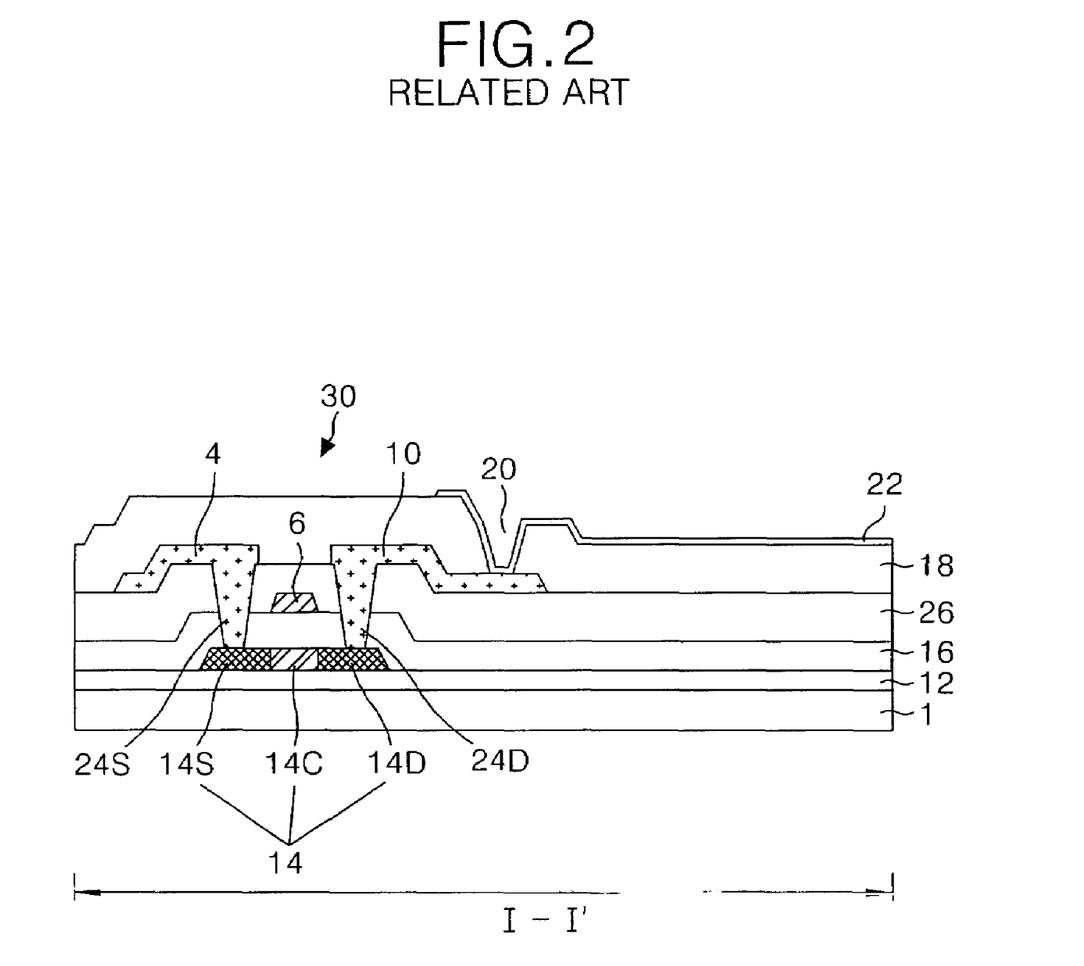
FIG. 2 is a cross-sectional view of the TFT substrate taken along the line I-I' in FIG. 1.

FIG. 1 is a plan view illustrating a portion of a TFT substrate in a poly-silicon LCD device according to the related art, and FIG. 2 is a cross-sectional view of the TFT substrate taken along the line I-I' in FIG. 1.

Referring to FIGS. 1 and 2, the TFT substrate includes a thin film transistor (TFT) 30 connected to a gate line 2 and a data line 4, and a pixel electrode 22 connected to the TFT 30. Although either an NMOS-TFT or PMOS-TFT can be used for the TFT 30, the TFT 30 employing an NMOS-TFT will now be described.

The TFT 30 has a gate electrode 6 connected to the gate line 2, a source electrode connected to the data line 4, and a drain electrode 10 connected to the pixel electrode 22 via a pixel contact hole 20 passing through a protective film 18. The gate electrode 6 overlaps a channel area 14C of an active layer 14 provided on a buffer film 12 with a gate insulating film 16 therebetween. The source electrode and the drain electrode 10 are formed in such a manner to be insulated from the gate electrode 6 with an interlayer insulating film 26 therebetween. Further, the source electrode and the drain electrode 10 are connected to a source area 14S and a drain area 14D of the active layer 14 doped with an $n^+$ impurity, respectively, via a source contact hole 24S and a drain contact hole 24D passing through the interlayer insulating film 26 and the gate insulating film 16.

The TFT substrate of the related art has disadvantages in that the manufacturing process is complicated and the manufacturing cost is high.

SUMMARY OF THE INVENTION

Accordingly, the present invention is directed to a poly-silicon display device and method of fabricating the same that substantially obviates one or more of the problems due to limitations and disadvantages of the related art.

An advantage of the present invention is to provide a thin film transistor substrate of a poly-silicon liquid crystal display device and a simplified method of fabricating the same.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, a liquid crystal display device includes a gate line and a data line connected to a thin film transistor; a gate pad connected to the gate line and a data pad connected to the data line, the data pad having the same cross-sectional structure as the gate pad; and a data link extended from the data pad and connected to the data line via a first contact hole, wherein the data line and the first contact hole are formed inside an area sealed by a sealant.

In another aspect of the present invention, a method of fabricating a liquid crystal display device includes forming a thin film transistor and a gate line and a data line, the gate and data lines connected the thin film transistor; forming a gate pad connected to the gate line and a data pad connected to the data line, the data pad having the same cross-sectional structure as the gate pad; and forming a data link extended from the data pad and connected to the data line via a first contact hole, wherein the data line and the first contact hole are formed inside an area sealed by a sealant.

In yet another aspect of the present invention, a method of fabricating a liquid crystal display device includes forming an active layer on a substrate; forming a first insulating film on the active layer; forming a first conductive pattern on the first insulating film, wherein the first conductive pattern includes a gate electrode, a gate line, a gate pad, a data pad, a data link and a pixel electrode and has a double-layer structure in which a metal layer is formed on a transparent conductive layer; forming source and drain regions by doping an impurity into the active layer; forming a second insulating film on the first conductive pattern; forming a source contact hole and a drain contact hole exposing the source and drain regions of the active layer and forming a transmission hole exposing the transparent conductive layer of the pixel electrode, and forming a gate pad contact hole and a data pad contact hole exposing the transparent conductive layer of the gate pad and the data pad; and forming a data line, a source electrode and a drain electrode on the second insulating film, wherein the data line, the source electrode and the drain electrode are formed inside an area sealed by a sealant.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 3:
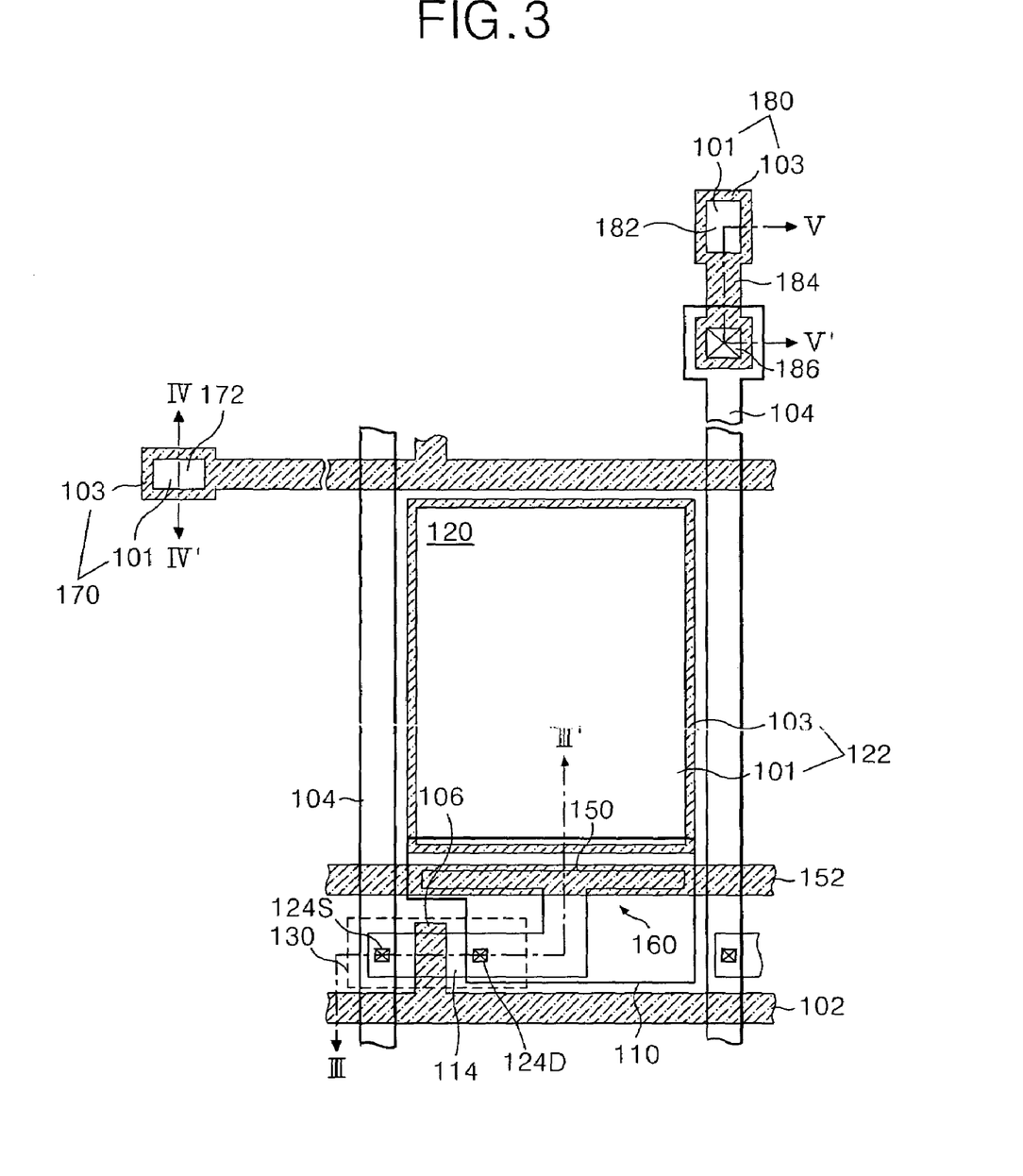
FIG. 3 is a plan view illustrating a portion of a thin film transistor substrate of a poly-silicon liquid crystal display according to an embodiment of the present invention.
Figure 4:
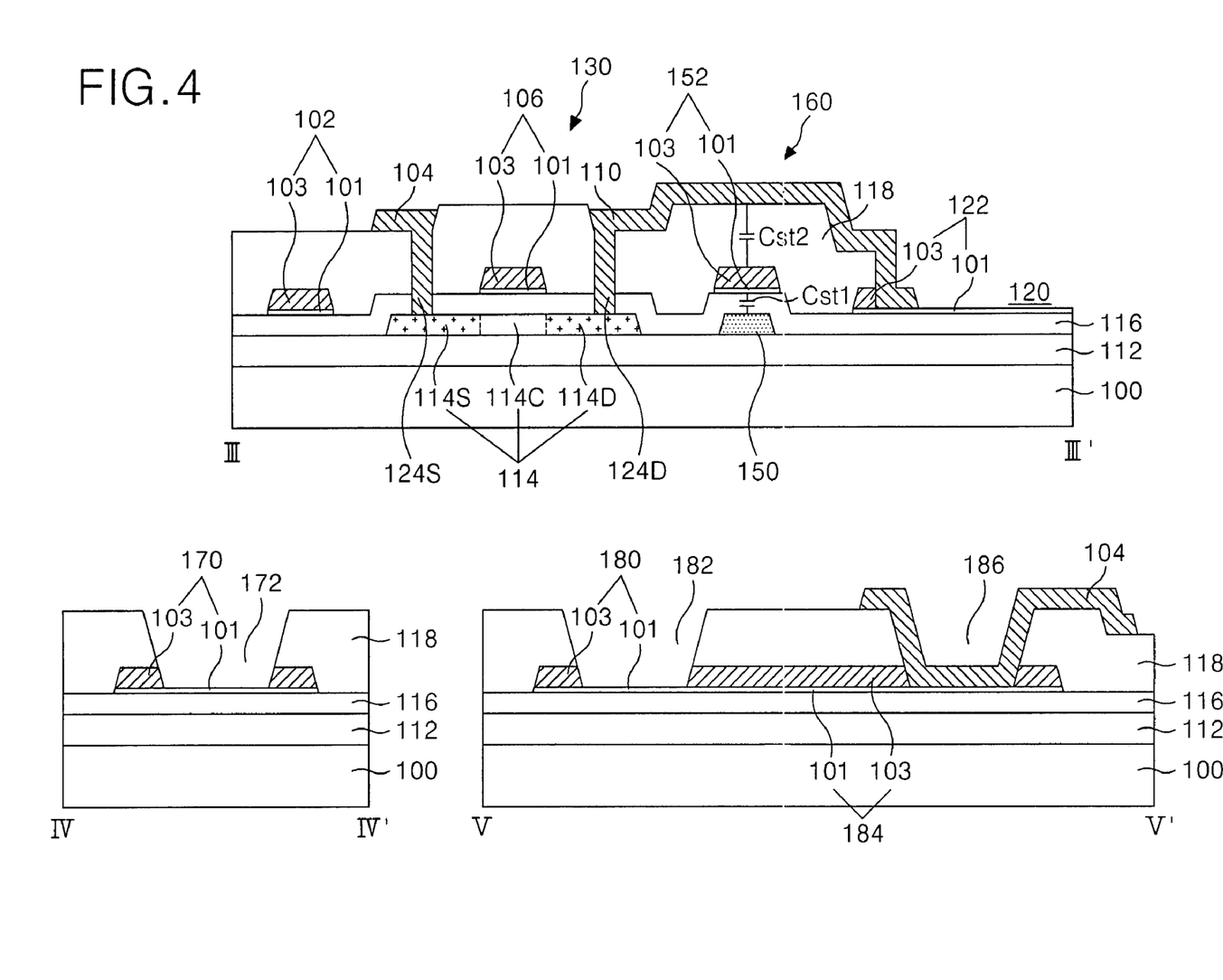
FIG. 4 illustrates cross-sectional views of the thin film transistor substrate taken along the line III-III', IV-IV' and V-V' In FIG. 3.

FIG. 3 is a plan view illustrating a portion of a thin film transistor substrate of a poly-silicon liquid crystal display according to an embodiment of the present invention, and FIG. 4 illustrates cross-sectional views of the thin film transistor substrate taken along the line III-III', IV-IV' and V-V' in FIG. 3.

Referring to FIGS. 3 and 4, the thin film transistor (TFT) substrate includes a TFT 130 connected to a gate line 102 and a data line 104, a pixel electrode 122 and a storage capacitor 160 connected to the TFT 130, a gate pad 170 connected to the gate line 102, and a data pad 180 connected to the data line 104. The data line 104 crosses the gate line 102 and a storage line 152 with an interlayer insulating film 118 therebetween to define a pixel area provided with the pixel electrode 122.

The TFT 130 applies a video signal on the data line 104 to the pixel electrode 122 in response to a gate signal from the gate line 102. To this end, the TFT 130 includes a gate electrode 106 connected to the gate line 102, a source electrode connected to the data line 104, a drain electrode 110 connected to the pixel electrode 122, and an active layer 114 for defining a channel between the source electrode and the drain electrode 110. Although the TFT 130 can be either an NMOS-TFT or PMOS-TFT, the TFT 130 employing an NMOS-TFT will now be described.

The gate line 102 and the gate electrode 106, along with the storage line 152, have a double-layer structure in which a metal layer 103 is formed on a transparent conductive layer 101.

The active layer 114 is formed on a lower substrate 100 with a buffer film 112 therebetween. The active layer 114 has a channel area 114C overlapping the gate electrode 106 with a gate insulating film 116 therebetween, and a source area 114S and a drain area 114D doped with an $n^+$ impurity. The source area 114S and the drain area 114D of the active layer 114 are connected to the source electrode and the drain electrode via a source contact hole 124S and a drain contact hole 124D passing through the interlayer insulating film 118 and the gate insulating film 116. The active layer 114 may further include a lightly doped drain (LDD) area (not shown) doped with an $n^-$ impurity between the channel area 114C and the source and drain areas 114S and 114D so as to reduce the off current of the TFT 130.

The pixel electrode 122 includes a transparent conductive layer 101 provided on the gate insulating film 116 in the pixel area, and a metal layer 103 along a periphery of the transparent conductive layer 101. In other words, the transparent conductive layer 101 of the pixel electrode 122 is exposed through a transmitting hole 120 passing through the interlayer insulating film 118 and the metal layer 103. Alternatively, the pixel electrode 122 may only include the transparent conductive layer 101 without the metal layer 103. The pixel electrode 122 crosses the storage line 152 and is connected to the drain electrode 110 extended along a side surface of the transmitting hole 120. More specifically, the drain electrode 110 is connected to the metal layer 103 and the transparent conductive layer 101 of the pixel electrode 122 exposed through the transmitting hole 120.

The TFT 130 charges a video signal into the pixel electrode 122 to generate a potential difference with respect to a common electrode of a color filter substrate (not shown). This potential difference rotates liquid crystal provided between the thin film transistor substrate and the color filter substrate due to the dielectric anisotropy of the liquid crystal, thereby controlling an amount of transmitted light inputted from a light source (not shown) via the pixel electrode 122 toward the color filter substrate.

The storage capacitor 160 includes first and second storage capacitors Cst1 and Cst2 connected in parallel between the storage line 152 and the TFT 130. The first storage capacitor Cst1 is provided such that the storage line 152 overlaps the lower storage electrode 150 extended from the active layer 114 with the gate insulating film 112 therebetween. The second storage capacitor Cst2 is provided such that the drain electrode 110 crosses the storage line 152 with the interlayer insulating film 118 therebetween. Because the storage capacitor 160 includes the first and second storage capacitors Cst1 and Cst2 connected in parallel, it has a high capacitance value. The storage capacitor 160 stably maintains a video signal charged in the pixel electrode 122 during a predetermined period of time.

The gate line 102 is connected to a gate driver (not shown) via the gate pad 170. The gate pad 170 is formed on the gate insulating film 116 and has a structure in which the transparent conductive layer 101 is exposed through a first contact hole 172 passing through the interlayer insulating film 118 and the gate metal layer 103. The gate pad 170 may only include the transparent conductive layer 101 without the gate metal layer 103.

The data line 104 is connected to a data driver (not shown) via the data pad 180. The data pad 180 has the same cross-sectional structure as the gate pad 170. In other words, the data pad 180 is formed on the gate insulating film 116 and has a structure in which the transparent conductive layer 101 is exposed through a second contact hole 172 passing through the interlayer insulating film 118 and the gate metal layer 103. The data pad 180 may only include the transparent conductive layer 101 without the gate metal layer 103.

The data line 104 is connected to the data link 184 extended from the data pad 180 via a third contact hole 186. The data link 184 also has a structure in which the transparent conductive layer 101 is exposed through the third contact hole 173 passing through the interlayer insulating film 118 and the gate metal layer 103 and the data line 104 is connected to the data link 184 via the third contact hole 186.

Figure 5:
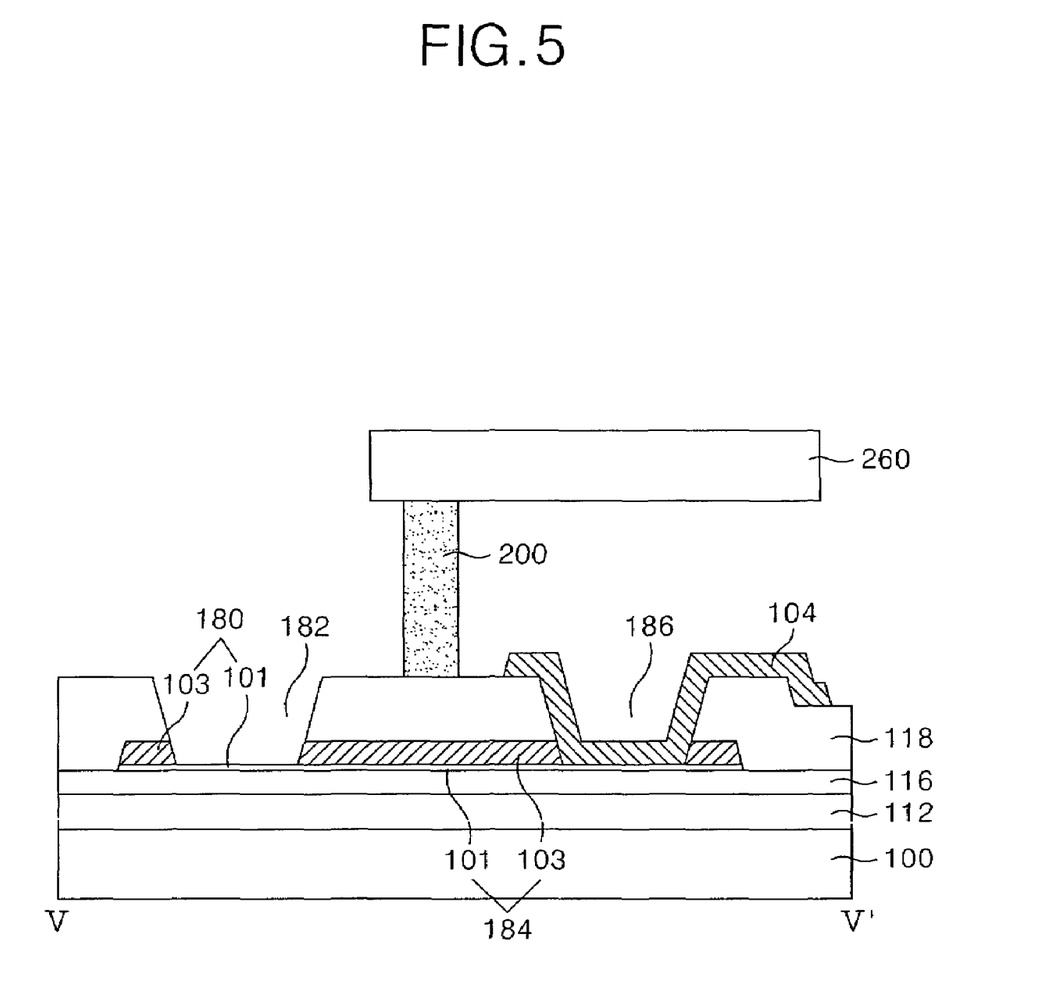
FIG. 5 is a cross-sectional view illustrating a data pad area of the thin film transistor substrate illustrated in FIG. 4.

The data line 104 is exposed due to absence of a protective film, thereby raising an illumination problem as well as a breakage problem caused by glass fibers contained a sealant crossing the data line 104. In order to overcome such problems, the data line 104 is spaced from the sealant 200 and located inside an area sealed by the sealant 200, as illustrated in FIG. 5. Thus, the data link 184 connected to the data line 104 is extended inside said area sealed by the sealant 200, and the third contact hole 186 connecting the data link 184 to the data line 104 is also positioned inside said area sealed by the sealant 200.

More specifically, the thin film transistor substrate of a poly-silicon liquid crystal display device according to the embodiment of the present invention is attached to the color filter substrate using the sealant 200, as illustrated in FIG. 5, and liquid crystal is filled into a cell gap formed between the two substrates. The liquid crystal can be provided between the two substrates either by a liquid crystal dropping method in which the liquid crystal is dropped on at least one of the two substrates and then the two substrates are attached to each other or by a vacuum injection method in which the two substrates are attached to each other and then the liquid crystal is injected into the cell gap formed between the two substrates. The sealant 200 is coated in such a manner to be not in contact with the data line 104, thereby preventing a breakage problem of the data line 104 caused by the glass fibers included in the sealant 200. Thus, all of the data line 104, the source electrode 110 and the drain electrode 112 provided on the thin film transistor substrate are positioned inside an area sealed by the sealant 200, so that they can be sufficiently protected by an alignment film (not shown) formed thereon as well as by the liquid crystal filled in the sealed area.

Figure 6A:
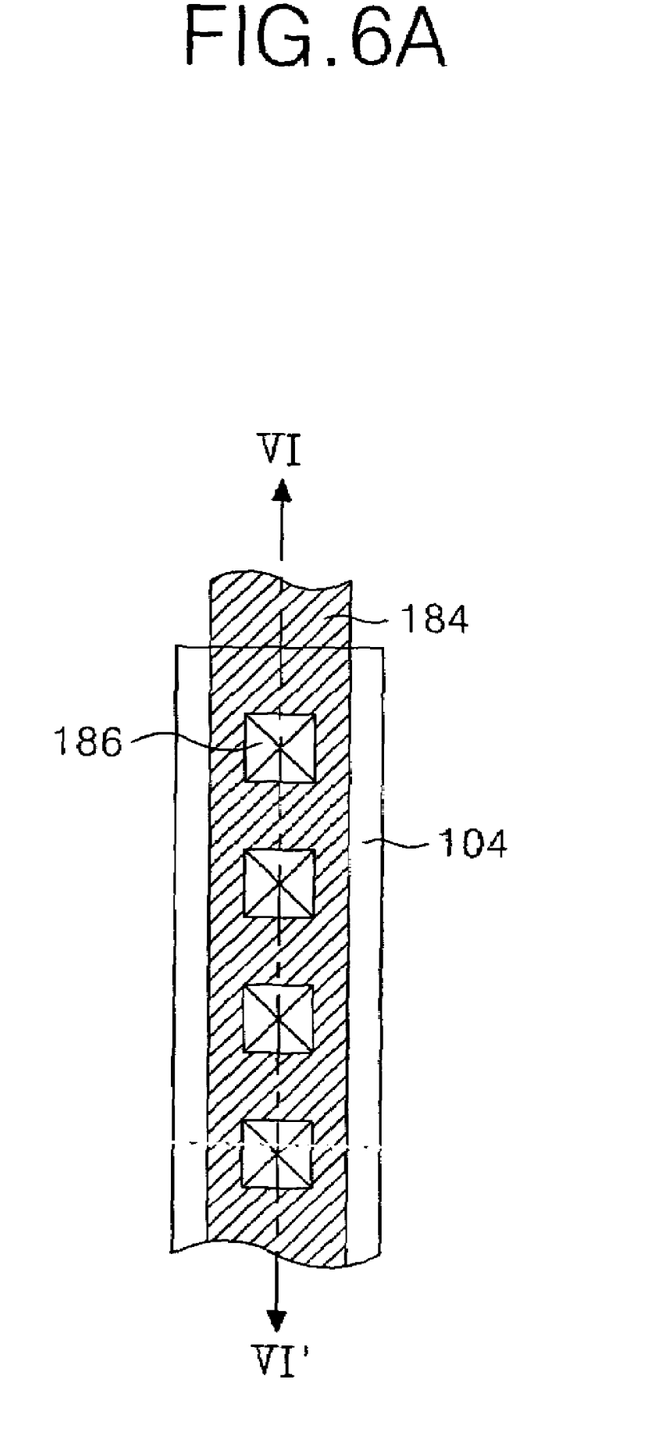
FIG. 6A and FIG. 6B are a plan view and a cross-sectional view of a contact portion between the data line and the data link in a thin film transistor substrate according to another embodiment of the present invention.
Figure 6B:
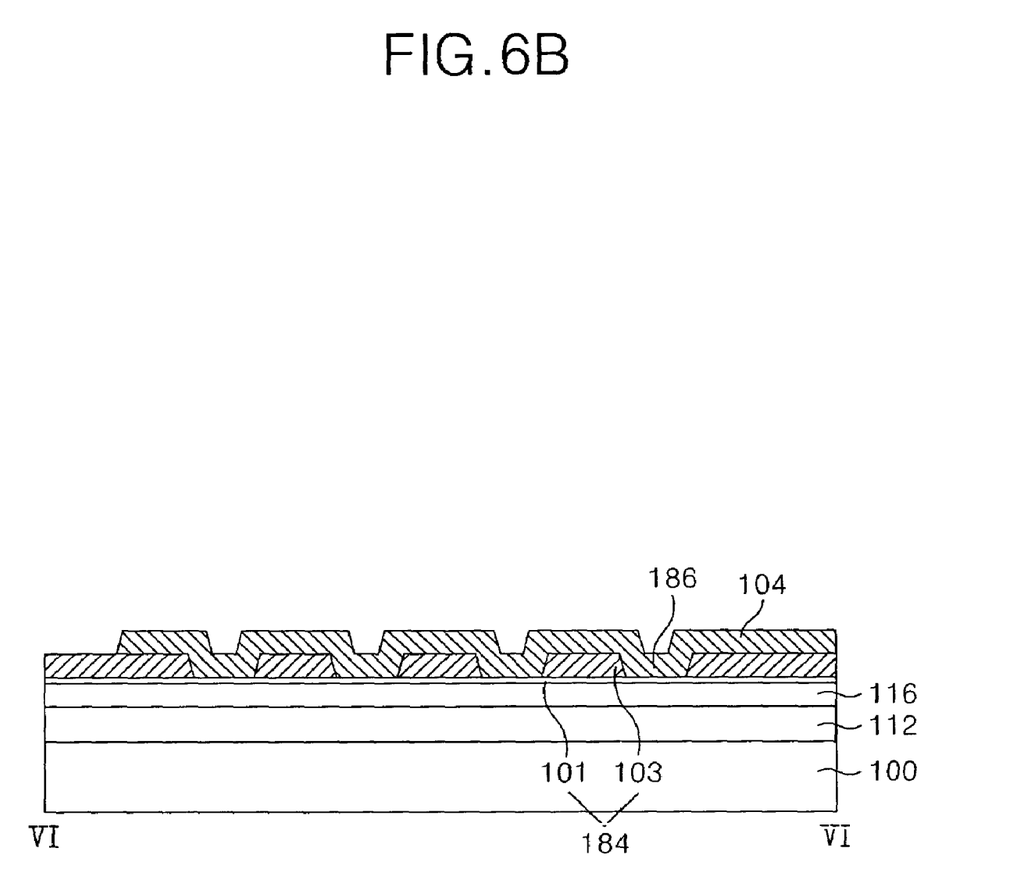

In order to reduce the resistance of the data line 104 to improve the picture quality, the data link 184 is extended along the data line 104 and connected to each other in parallel via a plurality of third contact holes 186, as shown in FIG. 6A and FIG. 6B.

As described above, in the TFT substrate according to the embodiment of the present invention, the pixel electrode 122, along with a double-layer structure of the gate line 102, the gate electrode 106 and the storage line 152, etc., is formed on the gate insulating film 116. As a result, the manufacturing process becomes simplified.

FIG. 7A to FIG. 7D are cross-sectional views illustrating a method of fabricating the thin film transistor substrate illustrated in FIG. 4.

Figure 7A:
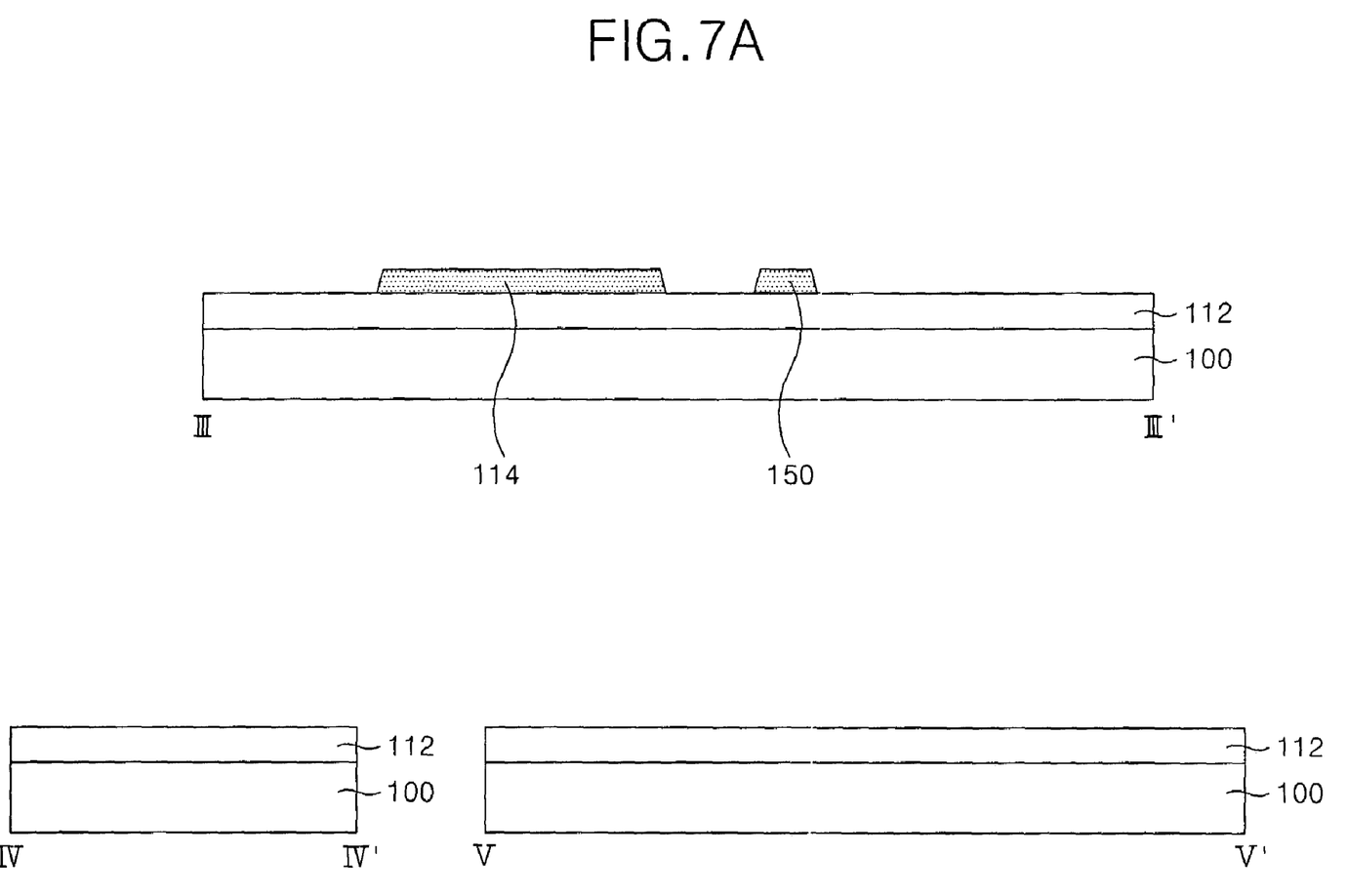
FIG. 7A to FIG. 7D are cross-sectional views illustrating a method of fabricating the thin film transistor substrate illustrated in FIG. 4.

Referring to FIG. 7A, the buffer film 112 is formed on the lower substrate 100, and then the active layer 114 and the lower storage electrode 150 are formed thereon by a first mask process.

To form the buffer film 112, an inorganic insulating film such as $SiO_2$, etc. is entirely deposited on the lower substrate 100. Next, an amorphous-silicon thin film is formed on the buffer film 112 by a low pressure chemical vapor deposition (LPCVD) technique or a plasma enhanced chemical vapor deposition (PECVD) technique, etc. and then is crystallized to form a poly-silicon thin film. A dehydrogenization process may be performed to eliminate hydrogen atoms existing in the amorphous-silicon thin film prior to the crystallization of the amorphous-silicon thin film. A laser annealing (ELA) technique such as the sequential lateral solidification (SLS) can be employed to crystallize the amorphous-silicon thin film, where grains grow in a horizontal direction to enlarge a size of the grains. The poly-silicon thin film is patterned by photolithography and etching processes using a first mask to form the active layer 114 and the lower storage electrode 150.

Figure 7B:
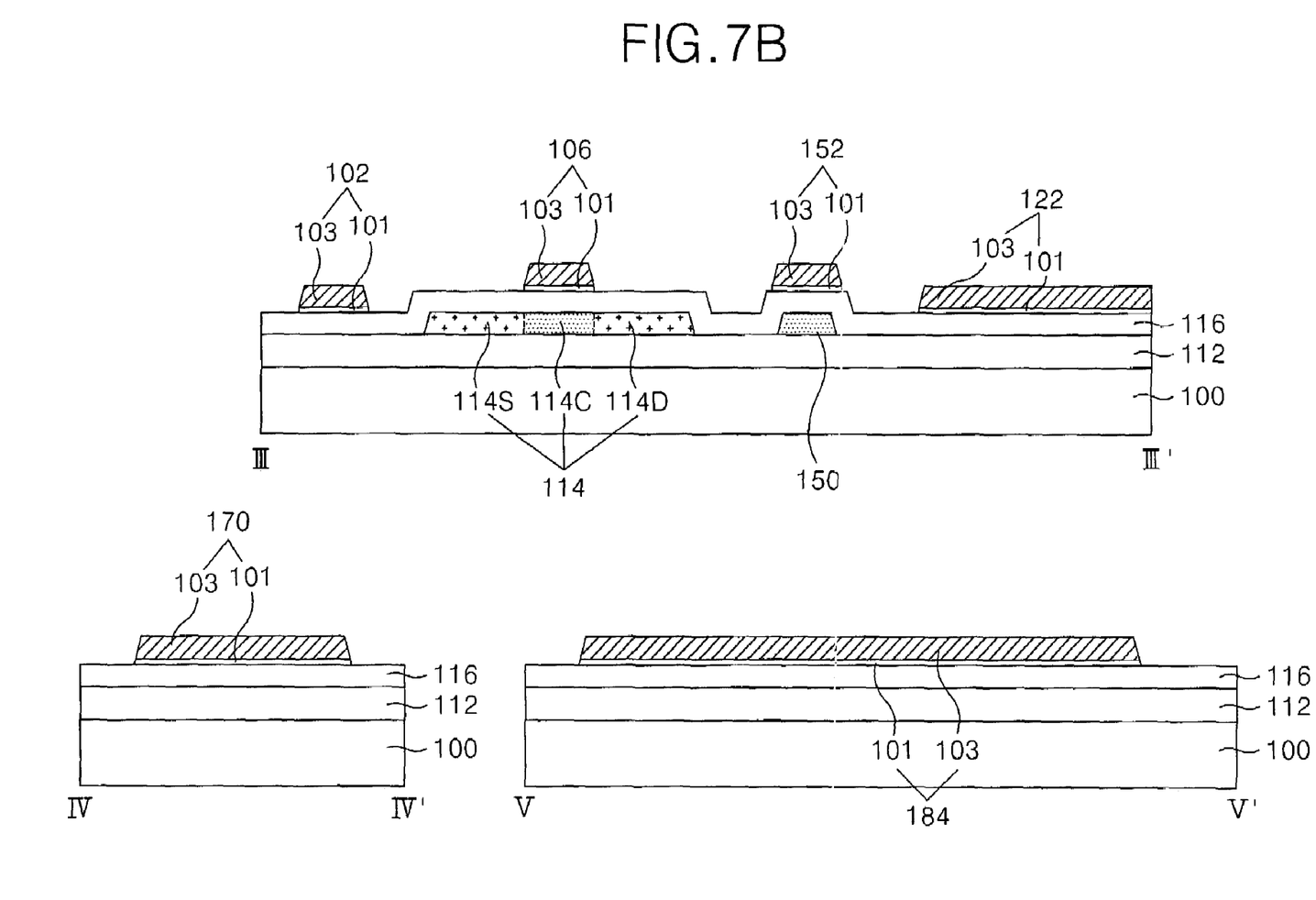

Referring to FIG. 7B, the gate insulating film 116 is formed on the buffer film 112 provided with the active layer 114 and the lower storage electrode 150, and a conductive pattern having a double-layer structure, which includes the gate line 102, the gate electrode 106, the storage line 152, the pixel electrode 122, the gate pad 170, the data pad 180 and the data link 184, is formed thereon by a second mask process.

To form the gate insulating film 116, an inorganic insulating film such as $SiO_x$ or $SiN_x$, etc. is entirely deposited onto the buffer film 112 provided with the active layer 114 and the lower storage electrode 150. Then, the transparent conductive layer 101 and the metal layer 103 are sequentially formed on the gate insulating film 116 by the sputtering, etc. The transparent conductive layer 101 is formed of indium-tin-oxide (ITO), tin-oxide (TO) or indium-zinc-oxide (IZO), etc., whereas the gate metal layer 103 has at least a single layer formed of a metal material such as Mo, Cu, AlNd, Al, Ti, Cr, a Mo alloy, a Cu alloy or an Al alloy, etc. Next, the metal layer 103 and the transparent conductive layer 101 are patterned by photolithography and etching processes using a second mask to thereby form the gate line 102, the gate electrode 106, the storage line 152, the pixel electrode 122, the gate pad 170, the data pad 180 and the data link 184.

Further, an $n^+$ type impurity is doped into the active layer 114 using the gate electrode 106 as a mask to thereby form the source area 114S and the drain area 114D of the active layer 114. The source and drain areas 114S and 114D of the active layer 114 are opposed to each other with a channel area 114C overlapping the gate electrode 106 therebetween.

Figure 7C:
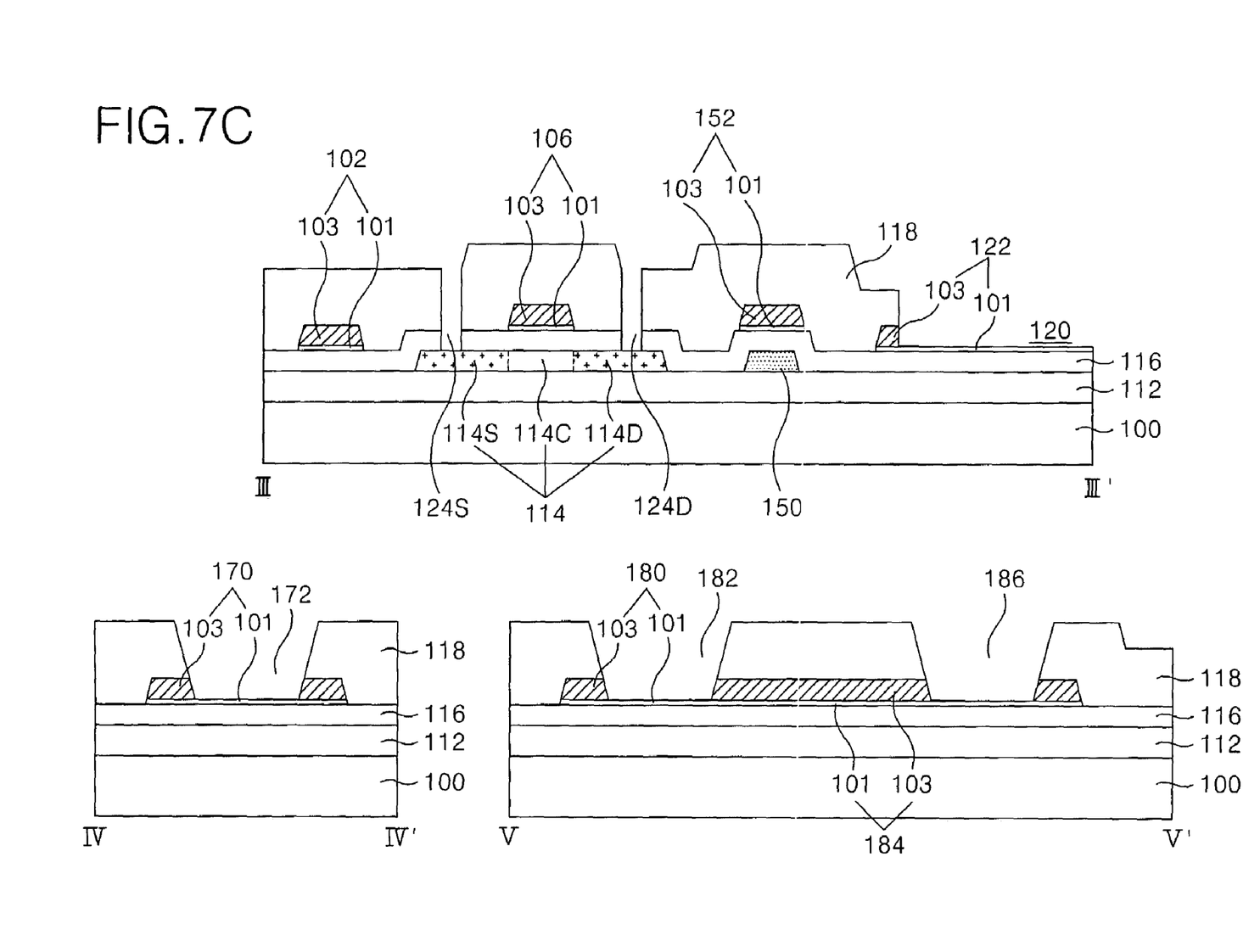

Referring to FIG. 7C, the interlayer insulating film 118 is formed on the gate insulating film 116 provided with the conductive pattern, and the source and drain contact holes 124S and 124D, the transmitting hole 120 and the first to third contact holes 172, 182 and 186 are formed thereon by a third mask process.

To form the interlayer insulating film 118, an inorganic insulating material such as $SiO_x$ or $SiN_x$, etc. is entirely deposited onto the gate insulating film 116 provided with the conductive pattern. Then, the source and drain contact holes 124S and 124D passing through the interlayer insulating film 118 and the gate insulating film 116, the transmitting hole 120 passing through the transmitting hole 120 and the first to third contact holes 172, 182 and 186 are formed by photolithography and etching processes using a third mask. The source and drain contact holes 124S and 124D expose the source and drain areas 114S and 114D of the active layer 114, respectively. The transmitting hole 120 exposes the gate metal layer 103 that is an upper layer of the pixel electrode 122, the first contact hole 172 exposes the gate metal layer 103 that is an upper layer of the gate pad 170, the second contact hole 182 exposes the gate metal layer 103 that is an upper layer of the data pad 180, and the third contact hole 186 exposes the gate metal layer 103 that is an upper layer of the data link 184.

Subsequently, the gate metal layers 103 of the pixel electrode 122, the gate pad 170, the data pad 180 and the data link 186 exposed through the transmitting hole 120 and the first to third contact holes 172, 182 and 186 are etched to expose the transparent conductive layers 101. The gate metal layer 103 may be left at a periphery of the transparent conductive layer 101.

Figure 7D:
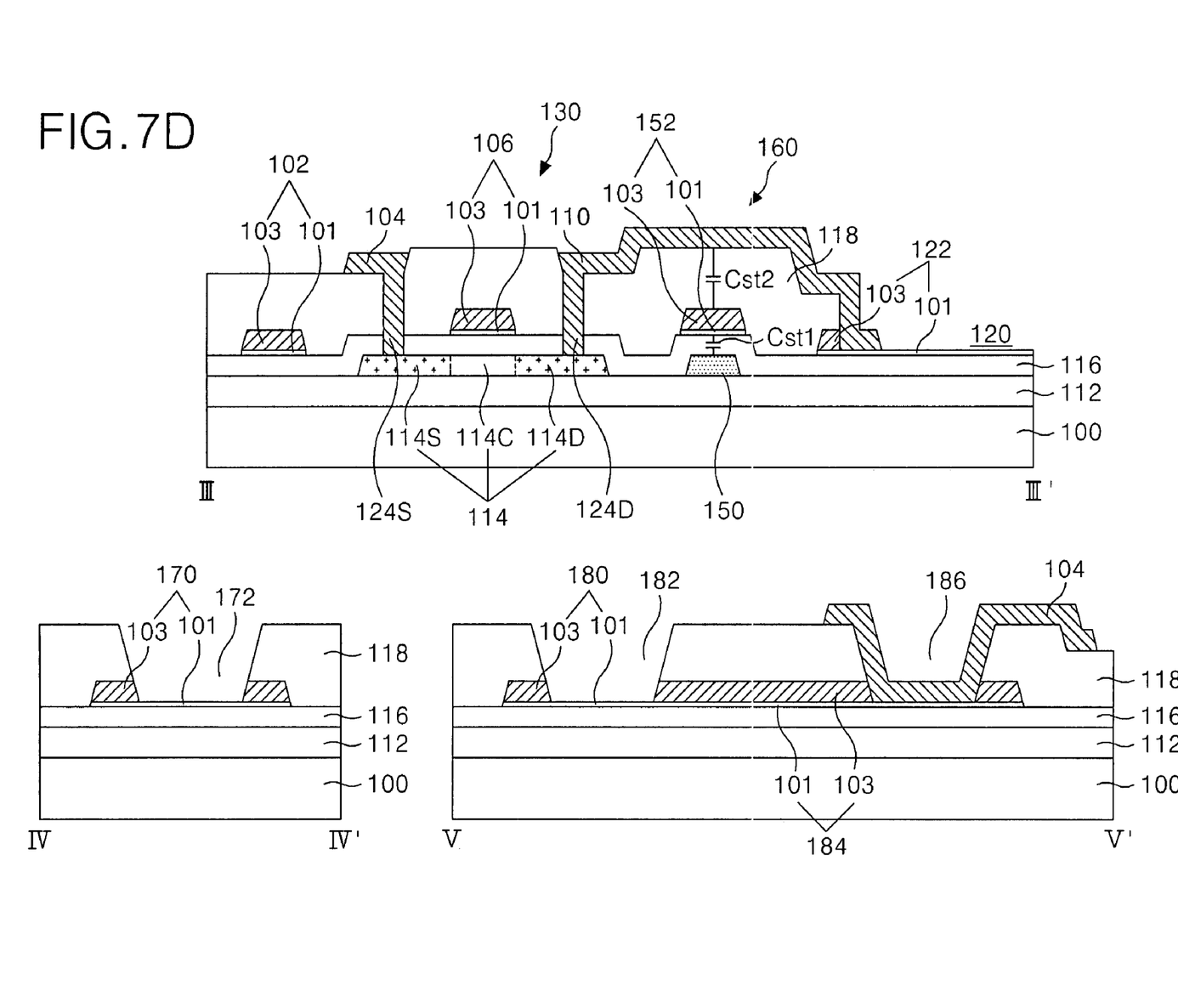

Referring to FIG. 7D, the data line 104 including the source electrode and the drain electrode 110 are formed on the interlayer insulating film 118 by a fourth mask process.

The data line 104 and the drain electrode 110 are provided by forming a source/drain metal layer on the interlayer insulating film 118 and then patterning the source/drain metal layer by photolithography and etching processes using a fourth mask. The data line 104 and the drain electrode 110 are connected to the source and drain areas 114S and 114D of the active layer 114 via the source and drain contact holes 124S and 124D. Further, the data line 104 is connected to the data link 184 via the third contact hole 186.

As described above, a TFT substrate of a poly-silicon liquid crystal display device according to the present invention is fabricated by a simplified four-mask process, thereby reducing the manufacturing cost and increasing the productivity. As a result, the data line 104 and the drain electrode 110 of the TFT substrate is exposed due to absence of a protective film. However, the data line 104 and the drain electrode 110 are located inside an area sealed by the sealant, so that they can be sufficiently protected by an alignment film coated thereon as well as the liquid crystal filled in the sealed area. In addition, the sealant is coated in such a manner, thereby preventing a breakage problem of t 104 caused by the glass fibers included in the sealant.

In addition, the data link connected to the data pad is connected to the data line via the contact hole and is located inside an area sealed by the sealant, thereby preventing or minimizing an illumination problem caused by absence of a protective film as well as a breakage problem caused by the contact between the data link and the glass fibers contained in the sealant.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A liquid crystal display device, comprising:
   a gate line and a data line connected to a thin film transistor;
   a gate pad connected to the gate line and a data pad connected to the data line, the data pad having the same cross-sectional structure as the gate pad; and
   a data link extended from the data pad and connected to the data line via a first contact hole,
   wherein the data line and the first contact hole are formed only inside an area sealed by a sealant.

2. The device of claim 1, wherein the gate line, the gate pad, the data pad and the data link has a double-layer structure in which a metal layer is formed on a transparent conductive layer.

3. The device of claim 2, wherein each of the gate pad and the data pad includes the transparent conductive layer exposed through a second contact hole passing through a first insulating film and the metal layer.

4. The device of claim 3, wherein the metal layers of the gate and data pads are located in a periphery of the second contact hole.

5. The device of claim 3, wherein the thin film transistor includes:
   an active layer on a substrate;
   a gate electrode having the double-layer structure and crossing the active layer with a second insulating film therebetween; and
   a source electrode and a drain electrode connected to a source region and a drain region of the active layer with the gate electrode therebetween.

6. The device of claim 5, wherein the gate electrode is connected to the gate line and the source electrode is connected to the data line.

7. The device of claim 6, further comprising a pixel electrode on the second insulating film, the pixel electrode connected to the drain electrode of the thin film transistor and having the double-layer structure.

8. The device of claim 7, wherein the pixel electrode is exposed through a transmission hole passing through the first insulating film.

9. The device of claim 8, wherein the metal layer encloses a periphery of the transmission hole.

10. The device of claim 5, further comprising:
    a storage line crossing the data line and having the double layer structure;
    a lower storage electrode connected to the active layer; and
    a storage capacitor formed by overlapping the lower storage electrode with the storage line with the second insulating film therebetween.

11. The device of claim 10, further comprising a second storage capacitor by overlapping the drain electrode with the storage line with the first insulating film therebetween.

12. The device of claim 11, wherein the drain electrode is connected to the pixel electrode, crossing the storage line, and exposed through the transmission hole.

13. The device of claim 2, wherein the first contact hole passes through the metal layer of the data link to expose the transparent conductive layer.

14. The device of claim 1, wherein the data line is spaced from the sealant by a predetermined length.

15. The device of claim 1, wherein the data link is extended along the data line and connected to the data line in parallel via a plurality of contact holes.

16. A method of fabricating a liquid crystal display device, comprising:
    forming a thin film transistor and a gate line and a data line, the gate and data lines connected the thin film transistor;
    forming a gate pad connected to the gate line and a data pad connected to the data line, the data pad having the same cross-sectional structure as the gate pad; and
    forming a data link extended from the data pad and connected to the data line via a first contact hole,
    wherein the data line and the first contact hole are formed only inside an area sealed by a sealant.

17. The method of claim 16, wherein the gate line, the gate pad, the data pad and the data link has a double-layer structure in which a metal layer is formed on a transparent conductive layer.

18. The method of claim 17, further comprising:
    forming a first insulating film on the gate pad and the data pad; and
    forming a second contact hole passing through the first insulating film and the metal layer to expose the transparent conductive layers of the gate and data pads.

19. The method of claim 18, wherein the metal layer encloses a periphery of the second contact hole.

20. The method of claim 18, wherein forming the thin film transistor includes:
    forming an active layer on a substrate;
    forming a gate electrode having the double-layer structure and crossing the active layer with a second insulating film therebetween; and
    forming a source electrode and a drain electrode connected to a source region and a drain region of the active layer with the gate electrode therebetween.

21. The method of claim 20, wherein the gate electrode is connected to the gate line and the source electrode is connected to the data line.

22. The method of claim 20, further comprising forming a pixel electrode on the second insulating film, the pixel electrode connected to the drain electrode of the thin film transistor and having the double-layer structure.

23. The method of claim 22, further comprising forming a transmission hole passing through the first insulating film and the metal layer to expose the transparent conductive layer of the pixel electrode.

24. The method of claim 22, further comprising:
   forming a storage line having the double-layer structure; and
   forming a lower storage electrode connected to the active layer;
   wherein a storage capacitor is formed by overlapping the lower storage electrode with the storage line, with the second insulating film therebetween.

25. The method of claim 24, wherein the storage line crosses the data line.

26. The method of claim 25, further comprising forming a second storage capacitor by overlapping the drain electrode with the storage line, with the second insulating film therebetween.

27. The method of claim 17, wherein the first contact hole passes through the metal layer of the data link to expose the transparent conductive layer.

28. The method of claim 16, wherein the data line is spaced from the sealant by a predetermined length.

29. The method of claim 16, wherein the data link is extended along the data line and connected to the data line in parallel via a plurality of contact holes.

30. A method of fabricating a liquid crystal display device, comprising:
   forming an active layer on a substrate;
   forming a first insulating film on the active layer;
   forming a first conductive pattern on the first insulating film, wherein the first conductive pattern includes a gate electrode, a gate line, a gate pad, a data pad, a data link and a pixel electrode and has a double-layer structure in which a metal layer is formed on a transparent conductive layer;
   forming source and drain regions by doping an impurity into the active layer;
   forming a second insulating film on the first conductive pattern;
   forming a source contact hole and a drain contact hole exposing the source and drain regions of the active layer and forming a transmission hole exposing the transparent conductive layer of the pixel electrode, and forming a gate pad contact hole and a data pad contact hole exposing the transparent conductive layer of the gate pad and the data pad; and
   forming a data line, a source electrode and a drain electrode on the second insulating film,
   wherein the data line, the source electrode and the drain electrode are formed only inside an area sealed by a sealant.

31. The method of claim 30, wherein the gate electrode crosses the active layer.

32. The method of claim 30, wherein the gate line is connected to the gate electrode and the gate pad is connected to the gate line.

33. The method of claim 30, wherein the data line is connected to the data link via a contact hole.

34. The method of claim 30, wherein the source and drain electrodes are connected to the source and drain regions of the active layer.

* * * * *